United States Patent [19]

Araya et al.

[11] Patent Number: 5,168,097
[45] Date of Patent: Dec. 1, 1992

[54] LASER DEPOSITION PROCESS FOR FORMING AN ULTRAFINE-PARTICLE FILM

[75] Inventors: Takeshi Araya, Higashikurume; Akira Matsunawa, Nishinomiya; Seiji Katayama, Suita; Susumu Hioki, Kashiwa; Mitsuaki Haneda; Ryoji Okada, both of Ibaraki, all of Japan

[73] Assignee: Hitachi, Ltd., Tokyo, Japan

[21] Appl. No.: 662,112

[22] Filed: Feb. 27, 1991

Related U.S. Application Data

[63] Continuation-in-part of Ser. No. 112,145, Oct. 26, 1987, abandoned.

[30] Foreign Application Priority Data

Oct. 27, 1986 [JP] Japan .................. 61-253817

[51] Int. Cl.$^5$ .................. B05D 3/06; B05D 5/12
[52] U.S. Cl. .................. 505/1; 505/732; 427/62; 427/314; 427/596
[58] Field of Search .................. 505/1, 730, 732; 427/53.1, 62, 63, 314

[56] References Cited

U.S. PATENT DOCUMENTS 4,619,691 10/1986 Araya et al. .................. 75/0.5 B
4,701,592 10/1987 Cheung .................. 427/53.1

OTHER PUBLICATIONS

Charschan, Ed. *Lasers in Industry*, (Van Nostrand Reinhold Co.) in 1972, pp. 232–233.
Dijkamp et al, *Appl. Phys. Lett* vol. 51, No. 8, 24 Aug. 1987, pp. 619–621.
Wu et al, *Appl. Phys. Lett*, vol. 51, No. 11, 14 Sep. 1987, pp. 861–863.
Moorjani et al, *Physical rev. B*, vol. 36, No. 7, 1 Sep. 1987—preprint date: 31 Jul. 1987.
Zaitsetcv—Zotov, Sov. Phys. Solid State 25(1), Jan., 1983 pp. 100–103.

*Primary Examiner*—Shrive Beck
*Assistant Examiner*—Roy V. King
*Attorney, Agent, or Firm*—Antonelli, Terry, Stout & Kraus

[57] ABSTRACT

The process for forming an ultrafine-particle film according to this invention is characterized by irradiating the surface of a target of a raw material with laser energy in a predetermined atmosphere under conditions where a plume is generated, exposing a substrate (a base material) directly to the plume generated, and thereby forming a film. The substrate is positioned in the plume at a distance, from the surface of the target of the raw material, of at least the mean free path of atoms and/or molecules of the raw material (or components thereof). By so positioning the substrate, ultrafine particles of the raw material are deposited on the substrate. The plume containing a large amount of ultrafine particles moves at a high speed; and exposure of the substrate, at the specified position relative to the target, to the plume causes strong adhesion of ultrafine particles contained in the plume to the substrate, resulting in formation of a film.

46 Claims, 6 Drawing Sheets

LASER DEPOSITION PROCESS FOR FORMING AN ULTRAFINE-PARTICLE FILM

This application is a continuation-in-part application of application Ser. No. 07/112,145 filed Oct. 26, 1987, now abandoned, the contents of which are incorporated herein by reference in their entirety.

BACKGROUND OF THE INVENTION

This invention relates to a process for forming an ultrafine-particle film, particularly to a process for forming an ultrafine-particle film in which various compounds, irrespective of metal or nonmetal, can be used as ultrafine particle materials.

For producing ultrafine particles by means of an arc, there has heretofore been utilized a mechanism in which a hydrogen-containing gas is dissolved in a molten metal, subjected to convection current therein, and liberated therefrom, as disclosed, for example, in U.S. Pat. No. 4,482,134 and Japanese Patent Publication No. 44725/82.

As methods for forming the thus obtained ultrafine particles into a film, there are known a method comprising coating a solution prepared by dissolving the particles in a solvent, and a method comprising spraying the particles by utilizing a gas flow.

In the above conventional production of ultrafine particles, the production efficiency is not taken into consideration. The conventional film forming methods described above have their respective defects as follows: the former method hardly permits formation of a film of high purity, while the latter method requires a complicated apparatus.

OBJECT AND SUMMARY OF THE INVENTION

An object of this invention is to provide a process for forming an ultrafine particle film of high purity, efficiently and easily.

A further object of this invention is to provide a process for forming an ultrafine particle film, using a plume, that is uniform in composition and thickness, and that has a same composition as raw material of the target of raw material forming the plume.

When irradiated with laser energy, the surface of a raw material takes various molten forms depending on the energy density. The present inventors have found that when a target of raw material was irradiated with laser energy under conditions where the plume phenomenon took place, and a substrate was placed a distance of at least a mean free path (that is, a distance of the mean free path or farther) from the target, a large amount of ultrafine particles are rapidly produced and deposited on the substrate. The present inventors succeeded in forming an ultrafine particle film of high purity easily on the surface of a substrate (a base material) by irradiating the surface of the substrate directly with the plume thus generated, the substrate being positioned a distance from the target (target surface) as set forth previously.

The present invention has been accomplished on the basis of this finding, and is characterized by irradiating the surface of a target of a raw material with laser energy in a predetermined atmosphere under conditions where a plume is generated, exposing a substrate (a base material) directly to the plume generated, the substrate being positioned a distance of at least a mean free path from the surface of the target, whereby the substrate is exposed to ultrafine particles in the plume, and thereby forming a film.

The "mean free path" as used in this application is the mean free path of atoms or molecules evaporated in the plume, from the target of raw material. It is not the mean free path of the ultrafine particles due to Brownian movement.

Where, e.g., the target of raw material includes a plurality of components, it is preferred that the substrate be spaced from the target a distance of at least the largest of the mean free paths of the atoms and/or molecules evaporated from the target.

It is preferable to heat the substrate previously. As a means for the heating, energy other than laser energy is preferred.

The predetermined atmospheric conditions include atmosphere pressure, atmosphere gas, a target to be irradiated with laser energy which is made a raw material for ultrafine particles, etc. When the atmospheric pressure is properly selected, and the substrate (on which the film is to be deposited) is positioned a sufficient distance from the target of raw material, ultrafine particles can be formed into a film so as to adjust their particle diameter distribution to a predetermined one. When the atmosphere gas is properly selected, a desired compound or a desired alloy film can be obtained by the reaction of this gas component with the plume and/or an intermediate product of the film formation or the film formed.

The raw material for ultrafine particles is not critical, and by proper selection thereof, a desired metal, alloy or nonmetal film can be formed. Furthermore, it is also possible to form a film of a mixture of a metal and a compound by properly selecting an alloy material and an atmosphere gas.

This invention is applicable to superconducting thin films composed of ultrafine particles. In this case, suitable raw materials are sintered bodies of oxide superconductors or the corresponding alloys, or ceramics and alloys having an element ratio different from that of a film to be formed which are used for attaining a desired composition of film. In forming a superconducting thin film it is preferable to cool a film rapidly or slowly after heating, and as a heat source for the heating, a heater or a high-frequency induction coil can be used. Slow cooling (e.g., 200° C./hr) is often more effective. In this case, as the substrate on which the thin film is formed, there may be exemplified $Al_2O_3$ substrates, MgO substrates, $SrTiO_3$ single crystal substrates, Si substrates, etc.

This invention includes not only activation of the surface of a target of a raw material by means of laser energy but also improvement in the production efficiency by employment of arc energy or electric discharge energy together with laser energy.

When a target of a raw material is irradiated with laser energy under conditions where the plume phenomenon occurs, and a substrate is positioned a sufficient distance (a distance of at least a mean free path) from the target, a large amount of ultrafine particles are rapidly produced. A plume containing a large amount of ultrafine particles (particles formed by the cohesion of metal vapor) moves at a high speed, and when the substrate is exposed thereto at a distance as described in the foregoing, ultrafine particles in the plume adhere to the substrate strongly to form a film. When the substrate is preheated, the adhesive strength is increased.

This invention permits formation of various ultrafine particles into a film immediately after their production, and hence is effective in that an ultrafine-particle film can be obtained with a high purity and a high efficiency. Moreover, the film has a uniform composition and thickness, the composition being that of the raw material.

DETAILED DESCRIPTION OF THE PREFERRED EMBODIMENTS

Figure 1:
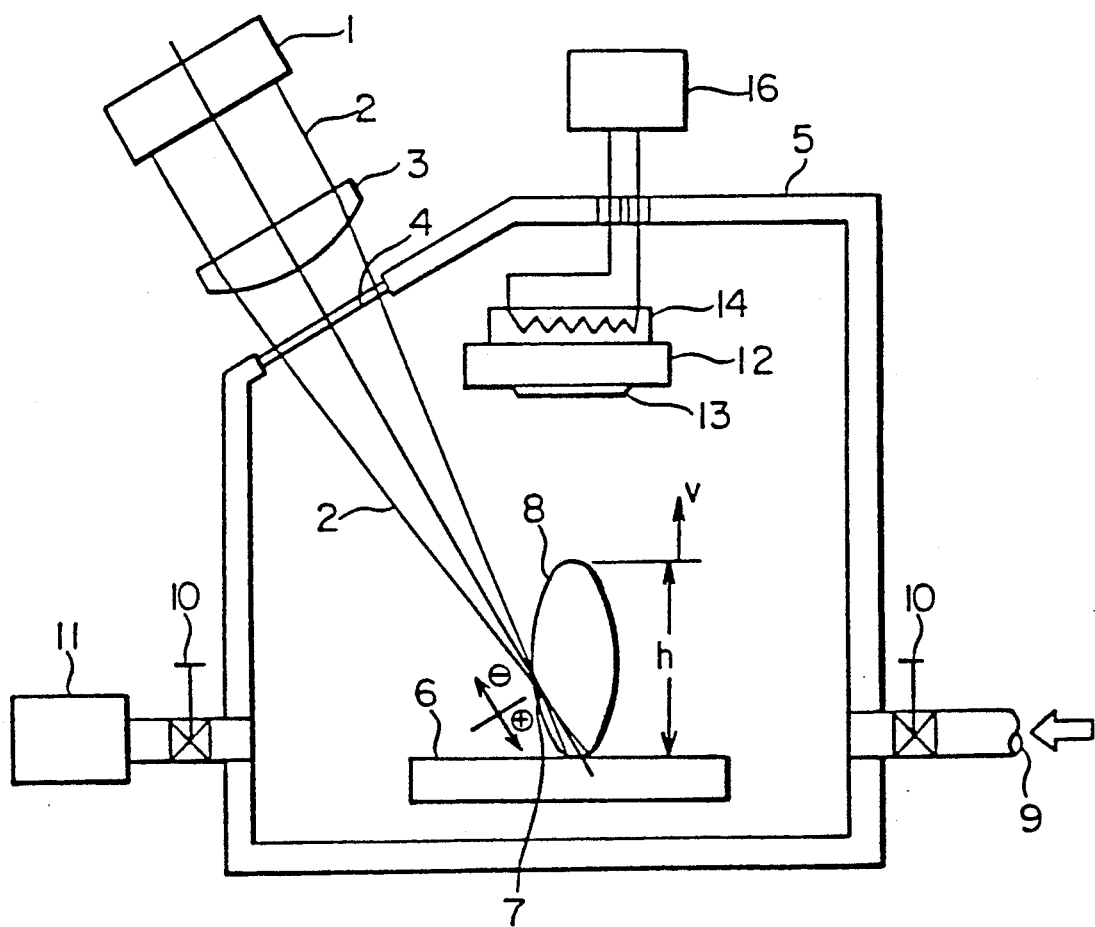
FIG. 1 is a schematic view of an apparatus for forming an ultrafine particle film to which one embodiment of this invention has been applied.

The present invention will be described in more detail in the following, in terms of specific embodiments. However, prior to description of the specific embodiments, a further description of the distance between the target of raw material and the substrate on which the film is to be formed, will be provided.

As described previously, the substrate is positioned a distance of at least the mean free path from the target of raw material. By positioning the substrate a distance of at least the mean free path, vaporized raw material from the target is allowed to grow into ultrafine particles; that is, the evaporated atoms and molecules from the target of raw material collide against molecules in the ambient atmosphere and against each other to grow (e.g., to cohere together) to form the ultrafine particles. The resultant particles form a glowing plume. For example, the evaporated atoms and molecules cohere together in the atmosphere to grow into the ultrafine particles, which are then transported to the substrate.

In a case of evaporating a raw material consisting of a plurality of components to form a plume of atoms and/or molecule of, e.g., the components, the substrate being positioned relatively close to the target of raw material (e.g., less than a mean free path from the target) to deposit components of the raw material in an atomic or molecular state on the substrate, thereby forming a thin film on the substrate, this film is not uniform in composition and/or thickness and does not have the same composition as that of the raw material due to the difference in the evaporating temperature between one of the components and the other. On the other hand, the ultrafine particles are formed by obtaining atoms and/or molecules by the decomposition with a laser and allowing these atoms and/or molecules to cohere together at a position distant by the mean free path or farther from the raw material at the laser-irradiated area thereof. Therefore, these ultrafine particles have entirely the same composition as that of the raw material. Thus, the resultant thin film also has the same composition as the raw material.

It is emphasized that, according to the present invention, ultrafine particles of the raw material of the target, rather than atoms and/or molecules of the raw material and/or components thereof, are deposited on the substrate. Illustratively, the ultrafine particles deposited are larger than such atoms and/or molecules (as seen in, e.g., FIGS. 9 and 10, the ultrafine particles deposited on the substrate, according to the present invention, are of the nanometer ($10^{-9}$ m) order in size; such molecules and/or atoms are of the angstrom ($10^{-10}$ m) order in size).

Thus, according to the present invention the substrate is positioned a sufficient distance from the target (at least a mean free path from the target) such that the atoms and/or molecules have cohered, so that at the substrate the plume contains substantially no atoms and/or molecules (preferably, contains none of such atoms and/or molecules of the raw material) and contains the ultrafine particles.

As can be seen in the foregoing, according to one aspect of the present invention the substrate (on which the film of ultrafine particles is to be deposited) is positioned a distance of at least a mean free path of the atoms and/or molecules of the raw material, from the target of raw material.

The degree of the mean free path is inversely proportional to the number of atoms in the atmosphere. The number of atoms constituting the plume is much less than the number of atoms (e.g., argon or oxygen atoms) constituting the atmosphere gas. Therefore, the mean free path of the raw material atoms or molecules is almost ruled by the atmosphere gas. In other words, the mean free path can be expressed by the following equation with the pressure of the atmosphere:

$$\lambda = 3.11 \times 10^{-24} T/P\delta^2,$$

wherein $\lambda$ is a mean free path in meters, T is a gas temperature in °Kelvin, P is an atmosphere pressure in Pa and $\delta$ is the diameter of atoms or molecules in meters. This equation itself is generally known.

Embodiments of this invention are described below with reference to the drawings. It will be understood that it is not intended to limit the invention to those embodiments. To the contrary, it is in intended to cover all alterations, modifications and equivalents as may be included within the spirit and scope of the invention as defined by the appended claims.

LASER IRRADIATION

FIG. 1 shows one example of structure of an apparatus for irradiating the surface of a target of raw material under conditions where a plume is generated, and adhering the thus generated plume to the surface of a base material (a substrate). In this embodiment, a YAG laser was used as laser source 1. Laser beam 2 emitted are converged by a condensing lens 3, pass through a glass plate 4, and enter an ultrafine-particle film-forming chamber 5. The laser beam 2 are irradiated on a target of raw material 6 placed near the center of the bottom of the ultrafine-particle film-forming chamber 5. The condenser lens 3 is intended to condense the laser beams 2 emitted from the laser source 1, and the distance from the focus is defined so as to have a minus value on the condensing lens 3 side or a plus value on the raw material 6 side both in relation to the focus position 7.

GENERATION OF A PLUME

When the laser energy E (joule/pulse) applied to the surface of the raw material 6 is too high, a large mount of spatter is generated, while when it is too low, a small amount of metal is evaporated but is difficult to observe clearly with the naked eye or by photography. When an appropriate energy is applied, the plume 8 containing a large amount of ultrafine particles is observed.

The term "plume" used herein means high-density vapor of metal and the like generated by partial electrolytic dissociation from the surface of a raw material by irradiation of said surface with laser energy or the like, which vapor shines and is observed as shown by the symbol 8 in FIG. 1. Such vapor contains atoms and/or molecules of the raw material or components thereof, which cohere to form the ultrafine particles.

Figure 2:
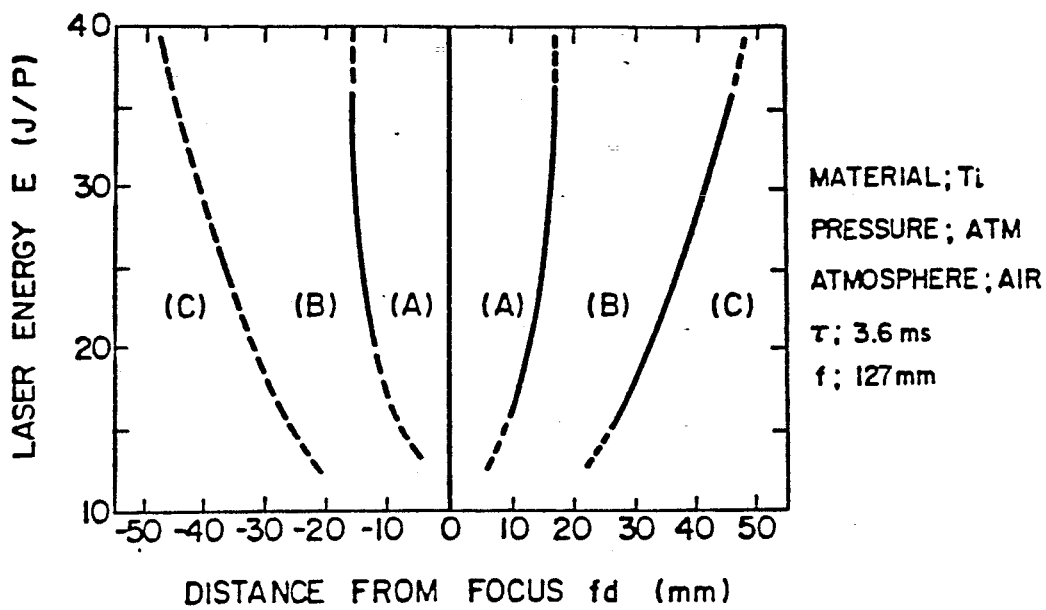
FIG. 2 is a characteristic graph showing the relationship between the distance from the focus of a condensing lens and laser energy.

The relationship between laser energy satisfying the generation conditions of the plume 8 and the distance $f_d$ from the focus to the surface of a target of the raw material is as shown in FIG. 2, in which (A) shows a region where spatter is generated concomitantly; (B) shows a region where only plume is generated; and (C) shows a region where no plume is generated. This relationship varies depending on the kind and surface condition of the raw material 6, the kind of atmosphere gas, and atmosphere pressure. In this embodiment, titanium (Ti) was used as a raw material, the atmosphere pressure P in the ultrafine-particle film-forming chamber 5 was adjusted to one atmospheric pressure, and the pulse period ($\tau$) of the laser beams 2 was adjusted to 3.6 ms. The focal length f of the condensing lens 3 was 127 mm, and the atmosphere gas was air. As a result of research for various raw materials, laser energy to be applied to the surface of a raw material for generating the plume was found to range from $10^4$ to $10^7$ W/cm$^2$.

As seen in the foregoing paragraph, the atmospheric pressure in the film-forming chamber can be relatively high (e.g., around 1 Pa or higher, such as 7 Pa).

Figure 3:
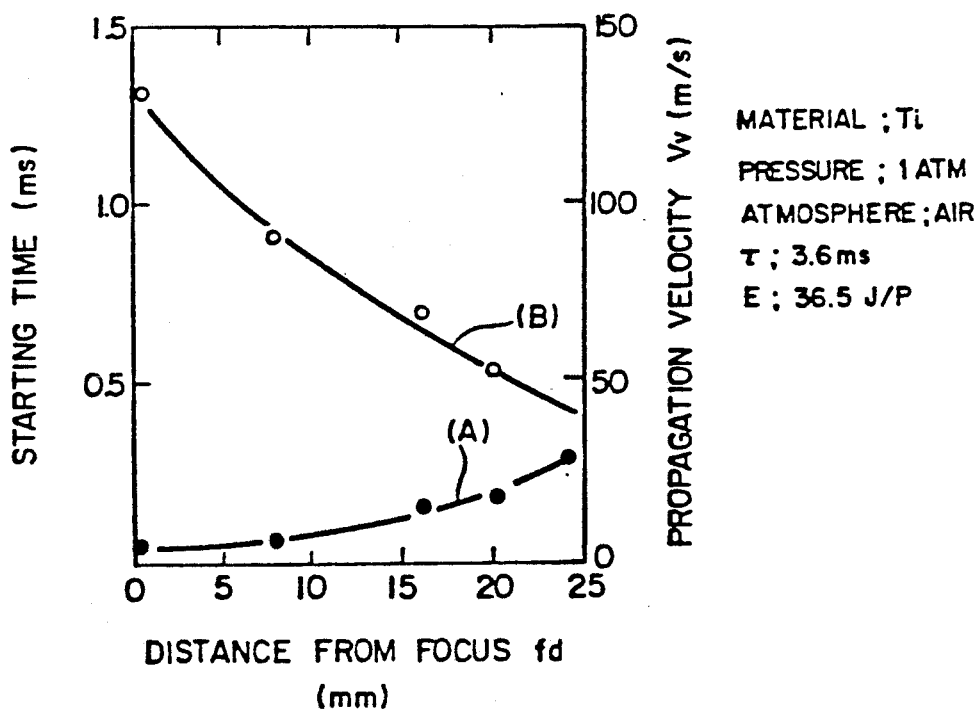
FIG. 3 is a characteristic graph showing the relationship among the distance from the focus, the starting time of generation of a plume, and the propagation velocity of end of the plume.

The generation of the plume 8 requires a period of 0.05 to 0.3 ms after irradiation with laser energy E, as shown by the curve (A) in FIG. 3. After this slight time lag, evaporation begins and the plume 8 moves as a high-speed vapor stream. This time (the starting time of the generation) varies depending on the intensity of the energy applied, namely, the distance from focus fd. The propagation velocity Vv of end of the plume 8 generated varies greatly depending on the applied energy E and the atmosphere pressure P, as shown by the curve (B) in FIG. 3 and in FIG. 4. The applied energy E and the atmosphere pressure P affect the generation rate and particle diameter of ultrafine particles, etc.

Figure 4:
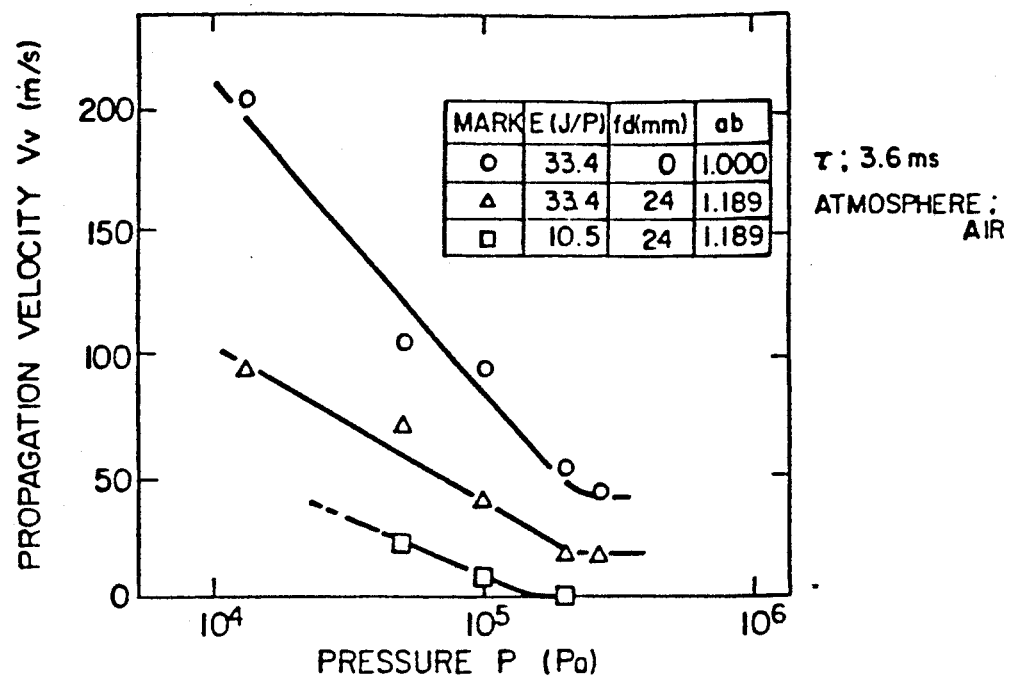
FIG. 4 is a characteristic graph showing the relationship between atmosphere pressure and the propagation velocity of end of the plume.

The symbol $a_b$ in FIG. 4 denotes the ratio of the distance between the lens 3 and the raw material 6 to the focal length f of the lens 3. In FIG. 3, the applied energy E was adjusted to 36.5 J/P and other conditions were the same as in FIG. 2. In FIG. 4, $\tau$ was adjusted to 3.6 ms, the atmosphere gas was air, and E, fd and $a_b$ were adjusted so as to be as shown in FIG. 4.

Figure 5:
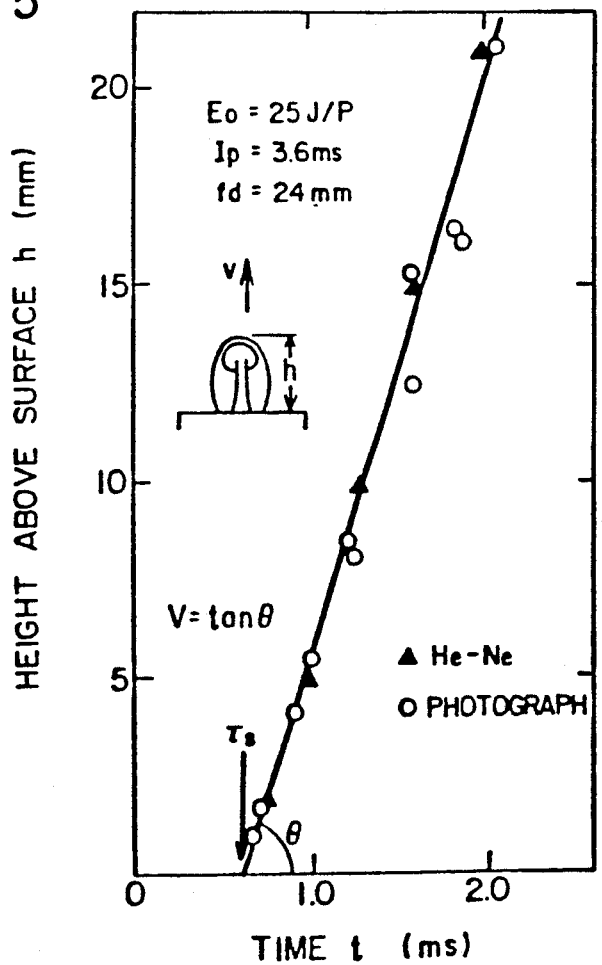
FIG. 5 is a characteristic graph illustrating the moving velocity of the plume and shows the relationship between the height of end of the plume and time.

FIG. 5 illustrates the way in which the plume 8 moves as a high-speed vapor stream away from the target material. During the movement of the plume 8 composed of metal vapor, evaporated atoms and/or molecules of the target material or components thereof are condensed in the space to form ultrafine particles.

The movement velocity of an end of the plume is shown by the slope in FIG. 5 (v=tan), and in this case, v=15 m/s. Although the movement velocity varies depending on laser irradiation conditions, raw material, atmosphere pressure, etc., examples thereof are shown in Table 1.

TABLE 1

| Raw material 6 | Ti | Al$_2$O$_3$ | Graphite |
|---|---|---|---|
| Velocity v(m/s) | 148 | 200 | 400 |

The pulse period $\tau$ is 3.6 ms and the laser energy E is 36.5 J/P from a YAG laser. As shown in Table 1, the movement velocity is the highest in the case of graphite. Therefore, exposure of a base material (a substrate) to the plume generated in the case of graphite, the substrate being positioned at least a mean free path from the target of the raw material, makes it possible to form a film of ultrafine particles.

PRODUCTION OF ULTRAFINE PARTICLES

In order to produce desired ultrafine particles, a predetermined gas is introduced into the ultrafine-particle film-forming chamber 5 through an atmosphere gas supplying pipe 9. The opening of this supply pipe 9 is in the vicinity of the bottom of the film-forming chamber 5 and at substantially the same height as the raw material 6, and a gas supplied flows out in the direction of the plume 8. A gate valve 10 is provided on the supply pipe 9. On the other side of the film-forming chamber 5, an exhaust pump 11 is provided for internal evacuation of the film-forming chamber 5, and a gate valve 10 is provided on the flow path thereof. The atmosphere pressure is controlled by means of the exhaust pump 11. As the atmosphere gas, a predetermined gas is supplied after the ultrafine-particle film-forming chamber 5 is evacuated to a vacuum of about $10^{-3}$ torr.

Figure 6:
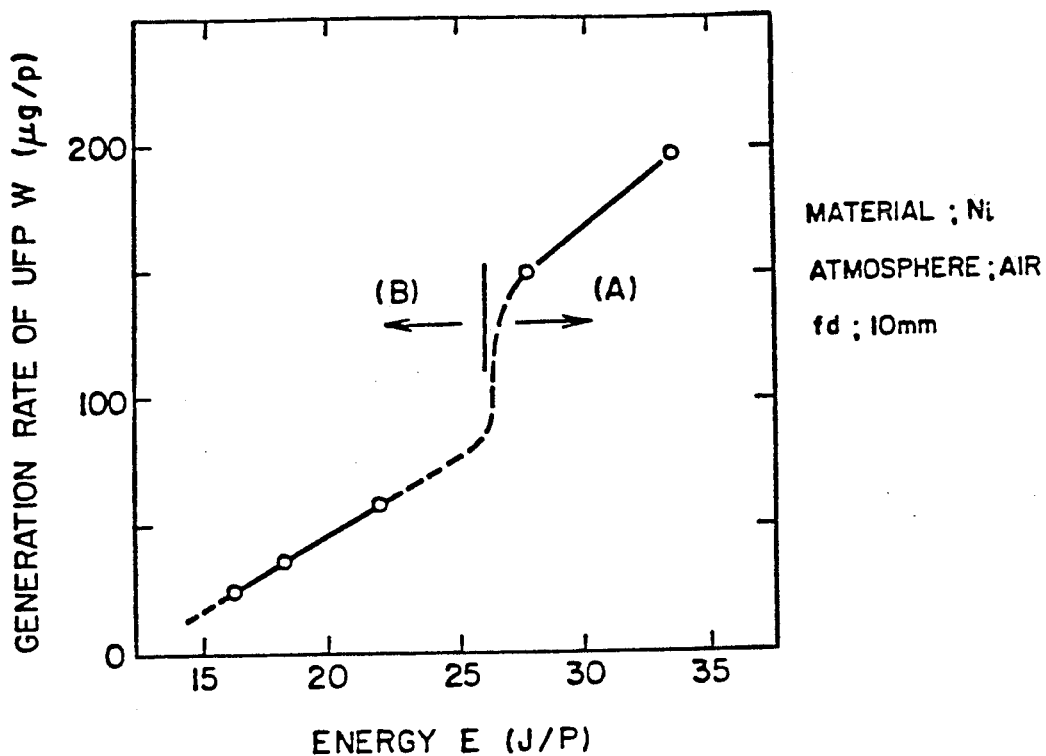
FIG. 6 is a characteristic graph showing the relationship between laser energy and the generation rate of ultrafine particles.

FIG. 6 illustrates the relationship between the applied energy E and the generation rate of ultrafine particles w. Ultrafine particles can be produced most efficiently by irradiation with energy in the region (B) in which energy is slightly lower than in the region (A) where sparks are generated concomitantly. Conditions under which this data was obtained were as follows: nickel (Ni) was used as the raw material 6, air was used as the atmosphere gas, and the distance from focus $f_d$ was adjusted to 10 mm.

Figure 7:
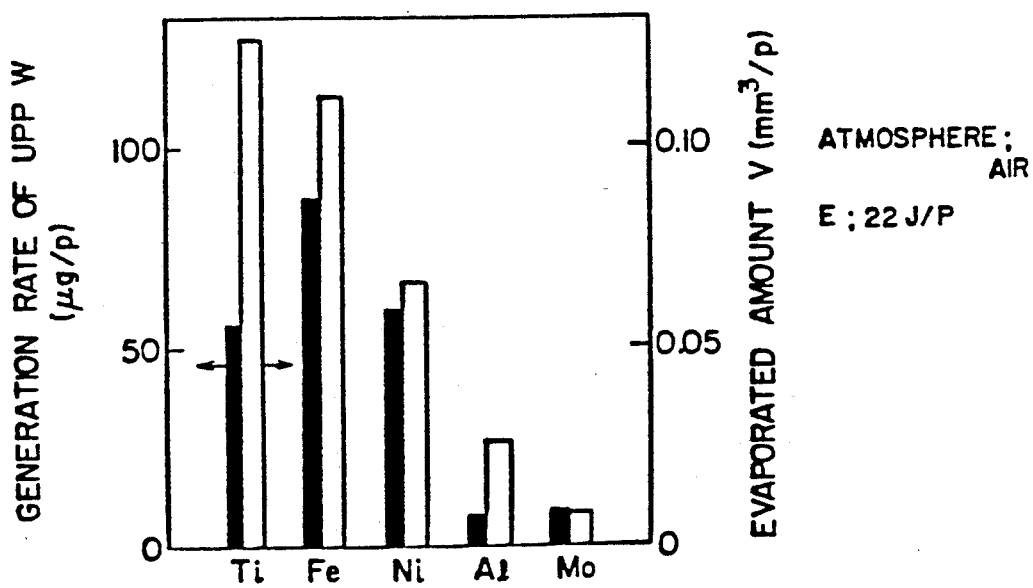
FIG. 7 is a characteristic graph showing relationship between the generation rate of ultrafine particles and evaporated amount established for various raw materials.

On the other hand, in FIG. 7 is shown the generation rate W and the evaporated amount V in the case of irradiation of each of various raw materials [titanium (Ti), iron (Fe), nickel (Ni), aluminum (Al) and molybdenum (Mo)] with a predetermined amount of energy. The applied energy E was 22 J/P, the atmosphere gas was argon, and $f_d$ was 10 mm. As shown in FIG. 7, the relationship between the generation rate W and the evaporated amount V varies depending on physical properties of the raw material (surface absorption energy, heat conductivity, evaporation temperature, melting point, etc.). In FIG. 7, the black bars refers to the weight loss, i.e., the generation rate, and the white bars to the evaporated amount. Therefore, it is recommended to conduct the irradiation by selecting energy conditions where the plume phenomenon occurs most vigorously, depending on the kind and surface condition of raw material, atmosphere gas, atmosphere pressure, the kind and wavelength of laser, the kind of optical system, the kind of glass plate, etc.

Figure 8:
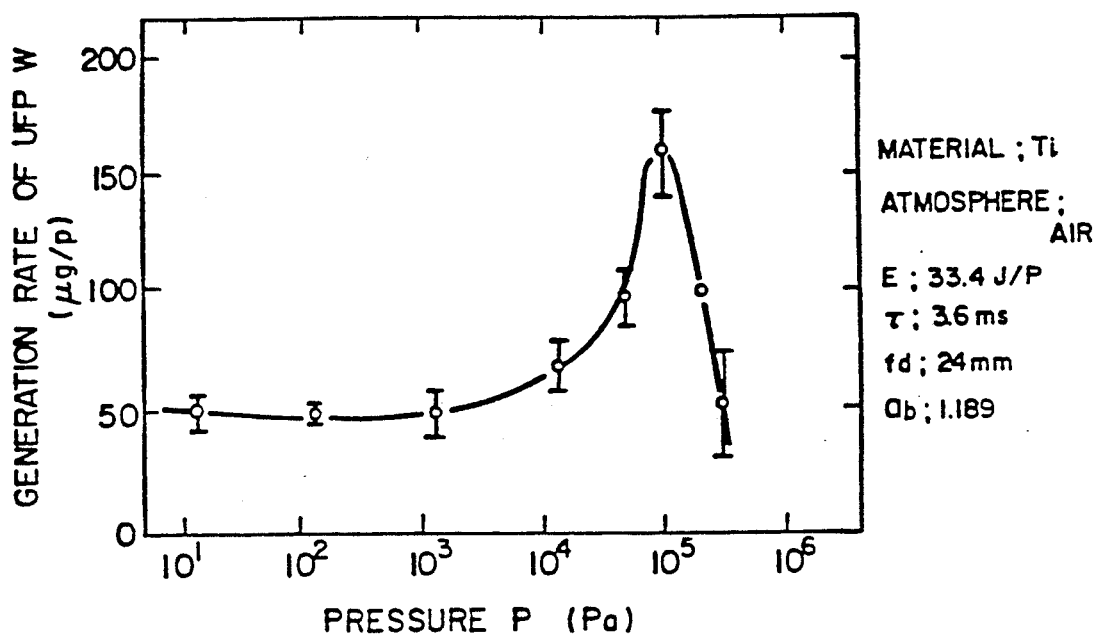
FIG. 8 is a characteristic graph showing the relationship between atmosphere pressure and the generation rate.

For example, in the relationship between atmosphere pressure and generation rate in the case of using titanium (Ti) as raw material, the generation rate is the highest, as shown in FIG. 8, when the atmosphere pressure is $10^5$ Pa which is close to the atmospheric pressure. The atmosphere gas was air, and the applied energy E, the pulse $\tau$, $f_d$ and $a_b$ were adjusted to 33.4 J/P, 3.6 ms, 24 mm and 1.189, respectively. From FIG. 8 and FIG. 4, it can be seen that when the atmosphere pressure is $5 \times 10^5$ Pa or less, the propagation velocity of the end of the plume and the generation rate are high.

Figure 9:
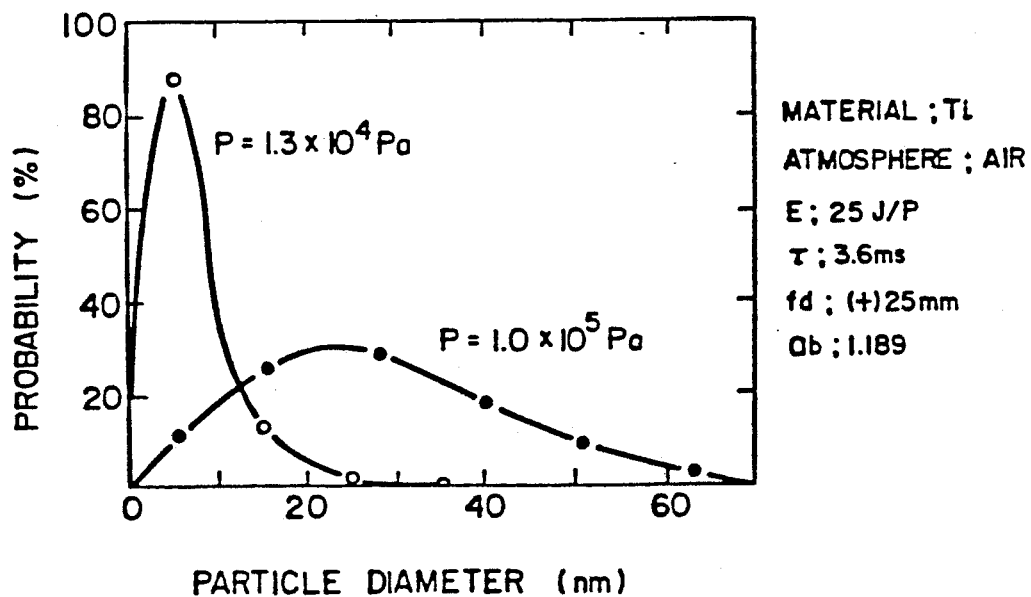
FIG. 9 and FIG. 10 are characteristic graphs showing the influence of atmosphere pressure on the particle diameter.

As shown in FIG. 9, the particle diameter distribution of ultrafine particles shows a particle diameter range of 5 to 65 nm when the atmosphere pressure P is $10^5$ Pa. On the other hand, when the atmosphere pressure is as low as $1.3 \times 10^4$ Pa, the generation rate is somewhat decreased but ultrafine particles uniform in particle diameter (5 nm) can be obtained. In FIG. 9, the raw material 6 is Ti; the atmosphere gas is air; E, $\tau$, $f_d$ and $a_b$ are 25 J/P, 3.6 ms, +25 mm and 1.189, respectively; and the axis of ordinate refers to the probability of generation.

Figure 10:
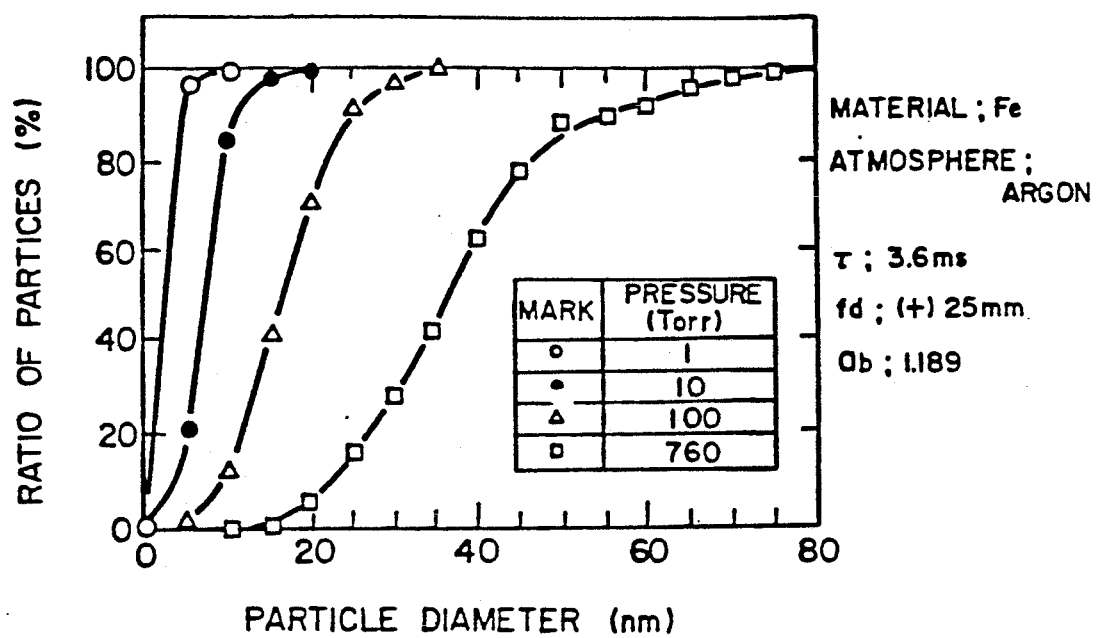

In FIG. 10 are shown data obtained when iron (Fe) was used as raw material and argon was used as atmosphere gas in place of air. It can be seen from FIG. 10 that irrespective of the kind of atmosphere gas, the lower the atmosphere pressure, the smaller (for example, 15 nm) and more uniform the particle diameter. For FIG. 9 and FIG. 10, it is clear that the particle diameter distribution of an ultrafine-particle film can be controlled by means of the atmosphere pressure.

As shown in Table 2, production of ultrafine particles by laser irradiation is possible in the case of almost all metal materials, and it is possible also in the case of nonmetals and alloys. In the case of an alloy, the composition of the resulting ultrafine particles tends to be somewhat different from that of the alloy.

Since the ultrafine particles produced are in a very active state, it becomes possible to produce various ceramic ultrafine particles (compound ultrafine particles) by direct chemical reaction of a plume and an atmosphere gas. In Table 2 are also listed examples of oxides produced in an oxygen gas atmosphere and examples of nitrides produced in a nitrogen gas atmosphere.

TABLE 2

| Starting metal | | Ultrafine particles (type) | | |
|---|---|---|---|---|
| | | Air | Oxygen gas | Nitrogen gas |
| IA | Cu | Cu(fcc) | | |
| IIA | Zn | Zn(hcp) | ZnO | Zn(hex) |
| IIIA | Al | Al(fcc) | $Al_2O_3$ ($\gamma$-, $\delta$-) | Al(fcc), AlN(hex) |
| IVA | Si | Si(dia) | Si(amorphous) | Si(dia) |
| | Sn | $\beta$-Sn(tetra) | $SnO_2$ | $\beta$-Sn, (SnO) (tetra) |
| | Pb | Pb(fcc) | $\alpha$-$PbO_2$ + PbO | Pb(fcc) |
| IVB | Ti | $\alpha$-Ti(hcp) | $TiO_2$ (anatase + rutile) | TiN(NaCl) |

TABLE 2-continued

| Starting metal | | Ultrafine particles (type) | | |
|---|---|---|---|---|
| | | Air | Oxygen gas | Nitrogen gas |
| | Zn | $\alpha$-Zr(hcp) | $ZrO_2$(Cubic + tetra + monoclinic) | ZrN(NaCl) |
| VB | V | V(bcc) | V(amorphous) | VN(NaCl) |
| | Nb | Nb(bcc) | $Nb_2O_5$ | $Nb_4N_3$(tetra) |
| | Ta | Ta(bcc) | —$Ta_2O_5$ | $Ta_2N$(hex) |
| VIB | Cr | Cr(bcc) | $Cr_2O_3$ | $\beta$-$Cr_2N$(hex) |
| | Mo | Mo(bcc) | $\eta$-$MoO_3$ | Mo(bcc) |
| | W | W(bcc, $\beta$-), $W_3O$ | $WO_3$ | W(bcc, $\beta$-), $W_3O$ |
| VIIB | Mn | $\beta$-Mn(cubic) | r-$Mn_2O_3$ | Mn(cubic), $Mn_4N$(hex) |
| VIII | Fe | $\alpha$-Fe(bcc) | $Fe_2O_3$ ($\gamma$-, $\epsilon$-) | $\alpha$-Fe(bcc) |
| | Co | Co(fcc), CoO | CoO | Co(fcc), CoO |
| | Ni | Ni(fcc) | NiO | Bi(fcc) |

Figure 11:
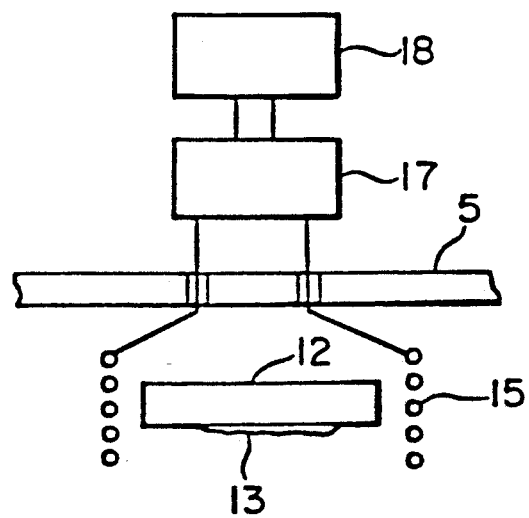
FIG. 11 is an enlarged schematic view of the vicinity of a base material which shows another embodiment of this invention.

Furthermore, ultrafine particles of a mixture of metal and ceramic can be produced by irradiating an alloy material with laser energy in a reactive gas atmosphere. For example, when a Fe - Ti alloy or a Ni - Ti alloy is irradiated with laser energy in a nitrogen gas atmosphere, the former alloy gives ultrafine particles of a mixture of Fe and TiN while the latter alloy gives ultrafine particles of a mixture of Ni and TiN. Since a part of the atmosphere gas is dissociated by laser energy or energy usable together therewith such as arc energy or energy of plasma generated, as shown in FIG. 11, by means of a high-frequency induction coil 15, carbide ultrafine particles can be produced using gases other than $N_2$ gas and $O_2$ gas such as methane ($CH_4$), acetylene (Ch≡CH), Freon ($CCl_2F_2$), propane ($C_3H_8$), butane ($C_4H_{10}$), etc. In addition to hydrocarbon gases, ammonia ($NH_3$), etc. can also be used. Thus, desired compound ultrafine particles of an oxide, nitride or carbide can be produced by selecting a suitable gas. Furthermore, compound ultrafine particles can similarly be obtained also by irradiating these compounds (ceramics) directly with laser energy. As a source of the energy used in this invention, there can be used, besides YAG laser, lasers on other oscillation methods such as $CO_2$ laser, dye laser, etc.

FILM-FORMING STEP

As described above, when the laser beam is irradiated on the target of raw material, atoms and/or molecules of the raw material or components thereof are vaporized and the plume 8 is generated; the atoms and/or molecules cohere to produce ultrafine particles, which, at the same time, move upward at a high speed. Therefore, when a gas material (subtrate) 12 is placed on their path, namely, in the direction of the end of the plume 8, the ultrafine particles collide therewith and accumulate thereon, whereby an ultrafine-particle film 13 can be formed.

Although in FIG. 1, the base material 12 is heated by means of a heater 14, a high-frequency induction coil 15 may be used as shown in FIG. 11. In addition to these heat sources, optical beams, lasers, etc. can also be used as heat sources. In FIG. 1, and FIG. 11, the symbol 16 shows an electric source for heater, the symbol 17 a matching device, and the symbol 18 an electric source of high frequency.

As described above, under conditions where a plume is generated, ultrafine particles can be produced and move to a base material (substrate), positioned a sufficient distance from the target of raw material, at a high speed simultaneously with their production, and hence an ultrafine-particle film of high purity can easily be obtained.

APPLICATION OF FORMATION OF A CERAMIC SUPERCONDUCTING THIN FILM

This invention is particularly applicable to production of ultrafine particles of an oxide superconducting material of ceramic, and to formation of a film of ultrafine particles of said material.

For example, an ultrafine-particle film of oxide superconducting material can be formed on the surface of a substrate by generating a plume in an atmosphere of oxygen, oxygen and an inert gas, oxygen and a fluoride gas, or the like by using as the target of raw material 6 an alloy (e.g., a Y-Ba-Cu alloy) which is such that an ultrafine-particle film formed by irradiating the alloy with the laser energy 2 has a predetermined composition as superconducting material (e.g., $YBa_2Cu_3O_{7-8}$). It is also possible to generate a plume, for example, in an inert atmosphere or an oxygen-containing atmosphere by using as raw material as sintered body of oxide superconductor having the corresponding composition.

Furthermore, it is also possible to obtain a desired superconducting material in the following manner. Each of metals (Y, Ba, Cu, etc.) which are to constitute a final product or each of the compounds thereof ($Y_2O_3$, $BaCO_3$, CuO, etc.) is irradiated with laser energy for a predetermined period of time to generate a plume, and the superconducting material is obtained while mixing the thus generated plumes during their movement to a base material (substrate).

When the atmosphere gas is ionized by means of the high-frequency induction coil 15 shown in FIG. 11, the reaction proceeds more effectively.

The film formed in the manner described above can be made into a high-temperature superconducting film on-line without exposure to the atmosphere, by using an inert gas, oxygen, oxygen and an inert gas, oxygen and a fluoride gas, or the like as the atmosphere gas in the film-forming chamber 5, and heating the film by means of the high-frequency induction coil 15 to heat-treat the same (for example, in the case of $YBa_2Cu_3O_{7-8}$ superconducting material, a starting alloy is heated in an oxygen gas atmosphere at 900° to 1050° C. for 5 hours and then cooled at a rate of 200° C./Hr.).

The sintered body used as raw material is, for example, a sintered body of calcined oxide superconductor powder. This sintered body is produced, for example, by a co-precipitation method, and specifically, it is a sintered body of $Y_{0.4}Ba_{0.6}CuO_3$ powder.

Furthermore, for example, a La-Bu-Cu-O series superconducting thin film can be formed in an argon gas atmosphere in consideration of irradiation time by using suitable oxides (or carbonate in the case of Ba) of the individual constituent metal elements.

At present, copper oxide (CuO) is an essential component of various oxide superconductors. There are various oxide superconductors but they always contain the copper oxide. Therefore, the mean free path λ of the copper oxide is shown below, using the equation for λ a set forth previously, with a parameter or the pressure of oxygen atmosphere at an atmosphere temperature of 25° C. and a maximum lattice length as molecule diameter of 0.511 nm.

| Atmosphere pressure (Pa) | Mean free path (m) |
|---|---|
| $1 \times 10^{-4}$ | 36 |
| $1 \times 10^{-2}$ | 0.36 |
| 1 | 0.0036 |

While we have shown and described several embodiments in accordance with the present invention, it is understood that the same is not limited thereto, but is susceptible to numerous changes and modifications as known to one having ordinary skill in the art, and we therefore do not wish to be limited to the details shown and described herein, but intend to cover all such modifications as are encompassed by the scope of the appended claims.

What is claimed:

1. A process for forming an ultrafine-particle film, which comprises irradiating a surface of a target containing raw materials with laser energy in a controlled atmosphere under conditions sufficient to generate a plume, the surface being irradiated so as to vaporize atoms and/or molecules from the raw materials, the atoms and/or molecules having mean free paths; and placing a substrate, on which the film is to be formed, within the plume but at a distance from the target to the substrate of at least the mean free paths of the atoms and/or molecules.

2. The process according to claim 1, wherein said substrate is previously heated.

3. The process according to claim 2, wherein said substrate is heated by energy other than the laser energy.

4. The process according to claim 2, wherein the heating of the substrate is carried out with an electric resistance heater or a high-frequency induction coil.

5. The process according to claim 1, wherein the formation of the ultrafine particle film on the substrate is carried out so as to adjust the particle diameter distribution in the film to a predetermined one, by selecting an atmosphere pressure as one of the conditions to generate the plume.

6. The process according to claim 5, wherein the pressure of said controlled atmosphere is at most $5 \times 10^5$ Pa.

7. The process according to claim 1, wherein a gas component of said controlled atmosphere is selected in such a manner that the gas component is reacted with a reactant selected from the group consisting of atoms and molecules in said plume and/or an intermediate product of the film formation or said film.

8. The process according to claim 1, wherein said film is cooled after it has been heated.

9. The process according to claim 1, wherein the laser energy irradiating the surface of the target is in the range of $10^4$ to $10^7$ W/cm$^2$.

10. The process according to claim 1, wherein said controlled atmosphere is ionized.

11. The process according to claim 1, wherein the surface of said target is irradiated by focuses laser energy, the focus position being spaced from the surface of said target, the distance from the focus position to the surface of the target having a positive value.

12. The process according to claim 1, wherein said ultrafine particle film is made of an oxide superconductor.

13. The process according to claim 12, wherein said oxide superconductor is of an yttrium-barium-copper-oxygen system.

14. The process according to claim 12, wherein said controlled atmosphere in an oxygen-containing gas.

15. The process according to claim 1, wherein the distance from the target to the substrate exceeds the mean free paths of the atoms and/or molecules.

16. The process according to claim 1, wherein the substrate is made of a material selected from the group consisting of $Al_2O_3$, MgO, $SrTiO_3$ and Si.

17. The process according to claim 1, wherein said distance is at least the largest mean free path of said atoms and/or molecules.

18. The process according to claim 17, wherein said distance exceeds the largest mean free path of said atoms and/or molecules.

19. A process for forming an ultrafine particle film, comprising the steps of forming ultrafine particles by irradiating the surface of raw materials with laser energy in a controlled atmosphere under conditions such that a plume containing ultrafine particles is generated, a vapor of materials of the raw materials being formed by the laser energy irradiation and the vapor cohering into the ultrafine particles, the ultrafine particles moving away from the raw materials, and forming the ultrafine particle film by placing a substrate in the path of the ultrafine particles a sufficient distance away from the surface of the raw materials such that the ultrafine particles have been formed upon reaching the substrate, and exposing the substrate directly to the plume containing ultrafine particles, the ultrafine particles accumulating on the substrate to form the ultrafine particle film.

20. A process according to claim 19, wherein said substrate is heated prior to exposing the substrate to the plume.

21. A process according to claim 19, wherein the step of forming ultrafine particles includes adjusting the particle diameter distribution to a predetermined one, by selecting an atmosphere pressure as one condition to generate the plume atmosphere.

22. A process according to claim 19, wherein by selecting an atmosphere gas as one condition to generate the plume, this atmosphere gas component is reacted with a reactant selected from the group consisting of atoms and molecules in said plume and/or an intermediate product of the film formation or said film, whereby a desired compound or alloy film is obtained.

23. A process according to claim 19, wherein the laser energy irradiating the surface of the raw materials is $10^4$–$10^7$ W/cm$^2$.

24. A process according to claim 19, wherein the controlled atmosphere is at a pressure of at most $5 \times 10^5$ Pa.

25. A process according to claim 19, wherein the controlled atmosphere in an oxygen-containing gas, a nitrogen-containing gas or a carbon-containing gas, whereby ultrafine particles of an oxide, a nitride or a carbide, respectively, are formed.

26. A process according to claim 19, wherein the controlled atmosphere is ionized.

27. A process according to claim 19, wherein the surface of the raw materials is irradiated by focused laser energy, the focus position being spaced from the surface of the raw materials, the distance from the focus position to the surface of the raw materials having a plus value.

28. A process according to claim 19, wherein the ultrafine particles have a size of 5–65 nm.

29. A process according to claim 20, wherein said substrate is heated by energy other than laser energy.

30. A process for producing an ultrafine particle film, comprising the steps of forming ultrafine particles by irradiating the surface of raw materials for oxide superconductor with laser energy in a controlled atmosphere under conditions such that a plume containing ultrafine particles is generated, a vapor of materials of the raw materials being formed by irradiating with the laser energy and the vapor cohering into the ultrafine particles, the ultrafine particles moving away from the raw materials, and forming the ultrafine particle film by placing a substrate in the path of the ultrafine particles a sufficient distance away from the surface of the raw materials, such that the ultrafine particles have been formed upon reaching the substrate, and exposing the substrate directly to the plume containing ultrafine particles, the ultrafine particles accumulating on the substrate to form the ultrafine particle film, of superconducting material.

31. A process according to claim 30, wherein the ultrafine particles have a size of 5–65 nm.

32. A process according to claim 30, characterized in that in the film formation, said film is cooled after being heated.

33. A process according to claim 32, characterized by using a heater or a high-frequency induction coil as a source for the heating.

34. A process for forming an ultrafine-particle film, comprising the steps of forming ultrafine particles by irradiating the surface of raw materials with laser energy in a controlled atmosphere under conditions such that a plume containing ultrafine particles is generated, a vapor of materials of the raw materials being formed by the irradiating with the laser energy and the vapor cohering into the ultrafine particles; and forming the ultrafine-particle film by (1) placing a substrate within a region of the plume, in the direction that the plume extends, farther from the raw materials than a position at which the ultrafine particles are formed, and (2) exposing the substrate directly to the plume containing ultrafine particles, so as to accumulate ultrafine particles on the substrate to form the ultrafine-particle film.

35. A process according to claim 34, wherein said substrate is heated prior to exposing the substrate to the plume.

36. A process according to claim 34, wherein an atmosphere gas is selected as one condition to generate the plume, this atmosphere gas containing an atmosphere gas component that reacts with a reactant selected from the group consisting of atoms and molecules in said plume and/or an intermediate product of the film formation or said film, whereby a desired compound or alloy film is obtained.

37. A process according to claim 34, wherein the raw materials are raw materials for oxide superconductor, the ultrafine-particle film being an ultrafine-particle film of superconducting material.

38. A process according to claim 37, characterized in that in the film formation, said film is cooled after being heated.

39. A process according to claim 38, characterized by using a heater or a high-frequency induction coil as a source for the heating.

40. A process according to claim 35, wherein said substrate is heated by energy other than laser energy.

41. A process according to claim 34, wherein the laser energy irradiating the surface of the raw materials is $10^4$–$10^7$ W/cm$^2$.

42. A process according to claim 34, wherein the controlled atmosphere is at a pressure of at most $5 \times 10^5$ Pa.

43. A process according to claim 34, wherein the controlled atmosphere is an oxygen-containing gas, a nitrogen-containing gas or a carbon-containing gas, whereby ultrafine particles of an oxide, a nitride or a carbide, respectively, are formed.

44. A process according to claim 34, wherein the controlled atmosphere is ionized.

45. A process according to claim 34, wherein the surface of the raw materials are irradiated by focused laser energy, the focus position being spaced from the surface of the raw materials, the distance from the focus position to the surface of the raw materials having a plus value.

46. A process according to claim 34, wherein the ultrafine particles have a size of 5–65 nm.

* * * * *